United States Patent
Choi et al.

(10) Patent No.: US 11,462,606 B2
(45) Date of Patent: Oct. 4, 2022

(54) DISPLAY DEVICE

(71) Applicant: Samsung Display Co., LTD., Yongin-si (KR)

(72) Inventors: Sang Kyu Choi, Hwaseong-si (KR); Su Jin Jung, Seoul (KR); Yeong Bong Kang, Asan-si (KR); Seong Sik Ahn, Yongin-si (KR); Ki Chang Lee, Cheonan-si (KR); Min Hyuk Im, Cheonan-si (KR); Myoung-Ha Jeon, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 204 days.

(21) Appl. No.: 17/011,965

(22) Filed: Sep. 3, 2020

(65) Prior Publication Data
US 2021/0159302 A1  May 27, 2021

(30) Foreign Application Priority Data
Nov. 27, 2019 (KR) .......... 10-2019-0154109

(51) Int. Cl.
*H01L 27/32* (2006.01)
*G06F 3/044* (2006.01)

(52) U.S. Cl.
CPC ...... *H01L 27/3276* (2013.01); *H01L 27/3223* (2013.01); *G06F 3/0446* (2019.05)

(58) Field of Classification Search
CPC ... H01L 27/32; H01L 27/3223; H05K 1/0277; H05K 1/028; H05K 1/0283; H05K 1/038; H05K 3/4691
See application file for complete search history.

(56) References Cited

U.S. PATENT DOCUMENTS

| | | | |
|---|---|---|---|
| 10,080,281 B2 * | 9/2018 | Jung | H01L 51/0097 |
| 10,555,426 B2 * | 2/2020 | Ahn | H04M 1/0277 |
| 10,561,022 B2 * | 2/2020 | Kwon | H01L 51/0097 |
| 2016/0370515 A1 | 12/2016 | Wang | |
| 2018/0063962 A1 | 3/2018 | Lee et al. | |
| 2019/0098793 A1 * | 3/2019 | Gridish | H04B 7/24 |
| 2019/0208642 A1 * | 7/2019 | Eun | G06F 1/1658 |

FOREIGN PATENT DOCUMENTS

KR  10-1885717  8/2018

\* cited by examiner

*Primary Examiner* — Sardis F Azongha
(74) *Attorney, Agent, or Firm* — H.C. Park & Associates, PLC

(57) ABSTRACT

A display device includes a display panel and a signal transmission film including a first extension portion, a second extension portion, and a first dummy pattern. The signal transmission film is connected to one side of the display panel. The first extension portion extends in a first direction, and a first contact hole is formed at a first side of the first extension portion. The second extension portion extends from the first side of the first extension portion in a second direction which is different from the first direction. The first dummy pattern is disposed adjacent to the first contact hole at the first side.

20 Claims, 13 Drawing Sheets

DISPLAY DEVICE

CROSS-REFERENCE TO RELATED APPLICATION

This application claims priority from and the benefit of Korean Patent Application No. 10-2019-0154109, filed on Nov. 27, 2020, which is hereby incorporated by reference for all purposes as if fully set forth herein.

BACKGROUND

Field

Exemplary embodiments of the invention relate generally to a display device, and more specifically, to a display device that includes a signal transmission film.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting diode display device.

A display device may include a display structure including pixels, a sensing structure disposed on the display structure and including a sensing electrode, and the like. In this case, the display structure may display an image through a light emitting layer, and the sensing structure may sense a portion of a user body or an object, which is located over a front surface of the display device, through the sensing electrode. In other words, the display device may receive an image signal provided to the display structure and a sensing signal provided to the sensing structure from an external device. In order to receive the image and sensing signals, signal transmission films configured to transmit the image and sensing signals may be attached to a portion of the display device, and the image and sensing signals generated from the external device may be provided to the display device through the signal transmission films.

The above information disclosed in this Background section is only for understanding of the background of the inventive concepts, and, therefore, it may contain information that does not constitute prior art.

SUMMARY

Additional features of the inventive concepts will be set forth in the description which follows, and in part will be apparent from the description, or may be learned by practice of the inventive concepts.

One or more exemplary embodiments of the present disclosure provides a display device including a signal transmission film.

According to one or more exemplary embodiments of the invention, a display device includes a display panel and a signal transmission film including a first extension portion, a second extension portion, and a first dummy pattern. The signal transmission film is connected to one side of the display panel. The first extension portion extends in a first direction, and a first contact hole is formed at a first side of the first extension portion. The second extension portion extends from the first side of the first extension portion in a second direction which is different from the first direction. The first dummy pattern is disposed adjacent to the first contact hole at the first side.

According to one or more exemplary embodiments, the signal transmission film may further include a third extension portion extending from a side of the second extension portion in the second direction and fourth extension portions protruding from the first extension portion in a third direction, which is opposite to the second direction.

According to one or more exemplary embodiments, the fourth extension portions of the signal transmission film may be bent about an axis extending in the first direction such that the signal transmission film is located on a bottom surface of the display panel.

According to one or more exemplary embodiments, the fourth extension portions may be connected to the one side of the display panel, and the first to fourth extension portions may be connected to and integrally formed with each other.

According to one or more exemplary embodiments, the signal transmission film may further include a first lower wire disposed in the second and third extension portions and the first side of the first extension portion and a first upper wire disposed in the first side of the first extension portion and one of the fourth extension portions.

According to one or more exemplary embodiments, the first lower wire and the first upper wire may be connected to each other through the first contact hole at the first side of the first extension portion.

According to one or more exemplary embodiments, the first lower wire and the first upper wire may be disposed on mutually different layers.

According to one or more exemplary embodiments, the first dummy pattern may include a first lower dummy pattern spaced apart from the first lower wire and a first upper dummy pattern spaced apart from the first upper wire.

According to one or more exemplary embodiments, the first lower dummy pattern and the first upper dummy pattern may be disposed on mutually different layers to overlap each other.

According to one or more exemplary embodiments, the signal transmission film may further include a lower substrate, a first insulating layer, a second insulating layer, and an upper substrate. The first insulating layer may be disposed on the lower substrate to cover the first lower dummy pattern at the first side of the first extension portion, and may have the first contact hole which exposes a portion of the first lower wire. The second insulating layer may be disposed on the first insulating layer to cover the first upper dummy pattern and the first upper wire. The upper substrate may be disposed on the second insulating layer.

According to one or more exemplary embodiments, the upper substrate may have a step which protrudes further than a periphery of the upper substrate from a portion where each of the first contact hole and the first upper and first lower dummy patterns is formed.

According to one or more exemplary embodiments, a second contact hole may be formed at a second side of the second extension portion, and the signal transmission film may further include a second dummy pattern adjacent to the second contact hole.

According to one or more exemplary embodiments, the signal transmission film may further include a second lower wire disposed in the third extension portion and the second side of the second extension portion and a second upper wire disposed in the second side of the second extension portion, the first extension portion, and one of the fourth extension portions.

According to one or more exemplary embodiments, the second lower wire and the second upper wire may be connected to each other through the second contact hole at the second side of the second extension portion, and the second lower wire and the second upper wire may be disposed on different layers.

According to one or more exemplary embodiments, the first lower wire and the second lower wire may be located on a same layer, and the first upper wire and the second upper wire may be located on a same layer.

According to one or more exemplary embodiments, the second dummy pattern may include a second lower dummy pattern spaced apart from the second lower wire and a second upper dummy pattern spaced apart from the second upper wire.

According to one or more exemplary embodiments, the signal transmission film may further include a third wire disposed in the third extension portion, the second extension portion, the first extension portion, and one of the fourth extension portions.

According to one or more exemplary embodiments, the third wire may not overlap the first lower wire and the second lower wire in the third extension portion, and the third wire may partially overlap the first upper wire or the second upper wire in the second extension portion and the first extension portion.

According to one or more exemplary embodiments, the display panel may include a display structure and a sensing structure disposed on the display structure, and the signal transmission film may be connected to the sensing structure.

According to one or more exemplary embodiments, the display panel may further include a protective member disposed on the sensing structure.

According to one or more exemplary embodiments of the invention, the display device includes the first dummy patterns and the second dummy patterns, so that the third steps and the fourth steps may be formed around the first step and the second step, respectively. Accordingly, the upper protective film may additionally make contact with the third steps and the fourth steps, and the adhesion between the upper protective film and the signal transmission film may be relatively increased at the first side. In other words, when the signal transmission film is bent, the upper protective film and the signal transmission film may not be separated from each other at the first side, and the misalignment of the signal transmission film may be prevented.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

DETAILED DESCRIPTION

Figure 1:
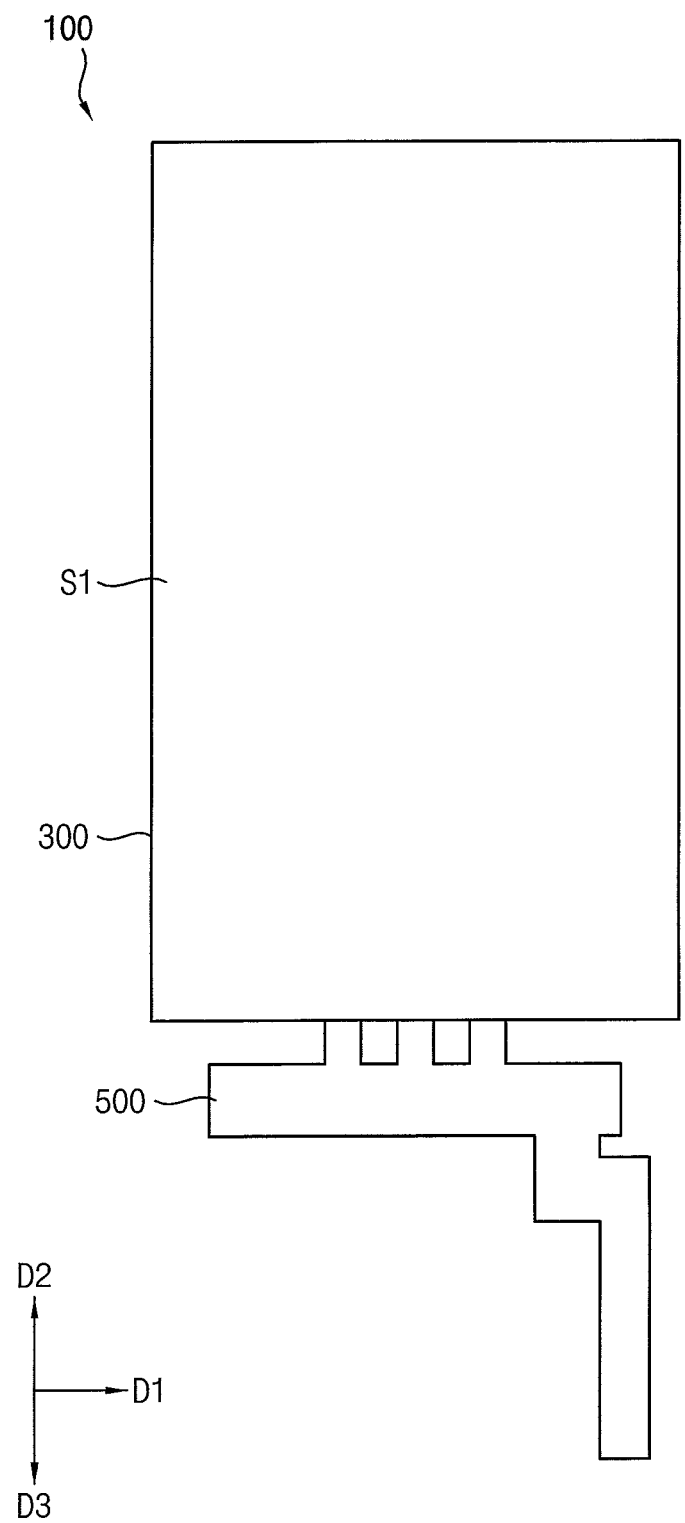
FIGS. 1 and 2 are plan views showing a display device according to embodiments of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
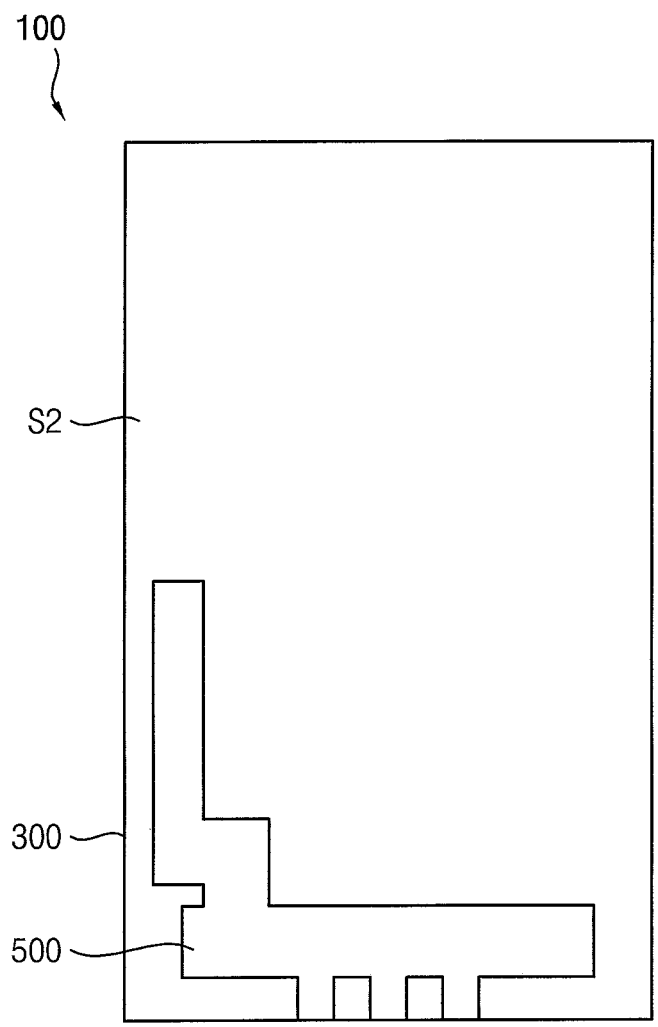
Figure 2:
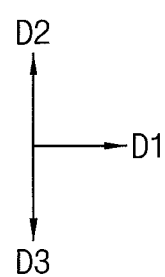
Figure 3:
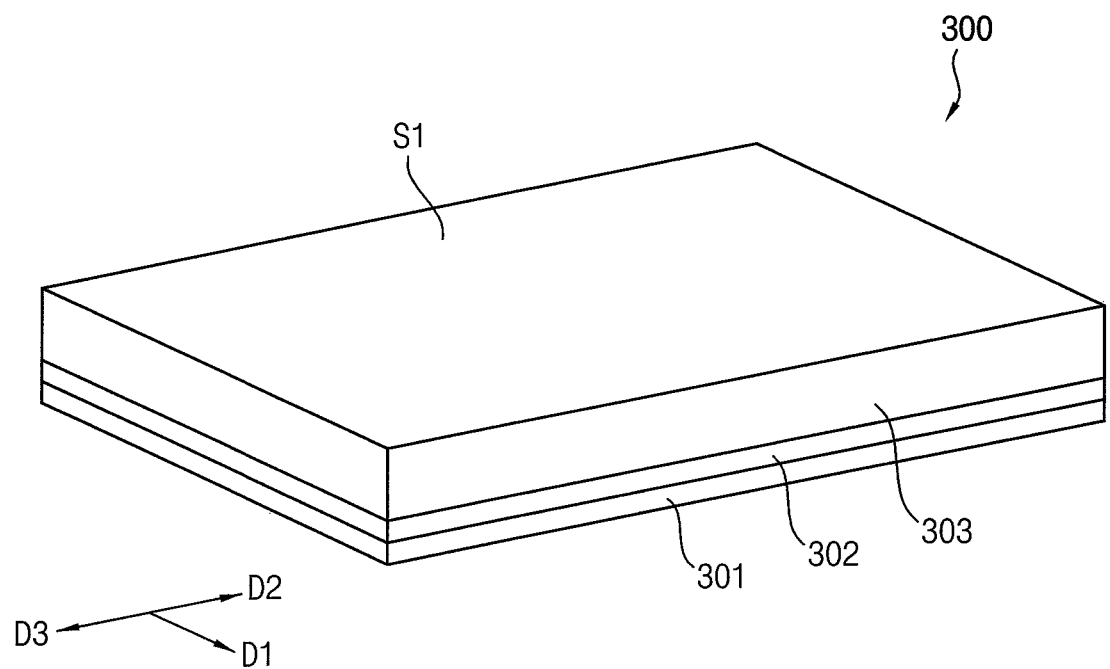
FIG. 3 is a perspective view showing a display panel included in the display device of FIG. 1.

FIGS. 1 and 2 are plan views showing a display device according to exemplary embodiments of the present invention, and FIG. 3 is a perspective view showing a display panel included in the display device of FIG. 1. For example, FIG. 1 is a plan view showing a front surface of a display device 100 before a signal transmission film 500 is bent, FIG. 2 is a plan view showing a rear surface of the display device 100 after the signal transmission film 500 is bent.

In FIGS. 1, 2 and 3, a display device 100 may include a display panel 300, a signal transmission film 500, and the like. In this case, the display panel 300 may include a display structure 301, a sensing structure 302, and a protective member 303, and the display device 100 may be divided into a first surface S1 (e.g., front surface) and a second surface S2 (e.g., rear surface). In exemplary embodiments, the signal transmission film 500 may be connected to the sensing structure 302.

The display structure 301 may be provided. A plurality of pixels (a lower electrode 290, a light emitting layer 330, and an upper electrode 340 of FIG. 4) included in the display structure 301 may emit light. In addition, the display structure 301 may further include a plurality of semiconductor elements (e.g., a semiconductor element 250 of FIG. 4) electrically connected to the pixels to control the pixels. The semiconductor elements may control the pixel by receiving image signals provided from an external device. Accordingly, the display structure 301 may display an image. For example, the image signal may include a gate signal, a data signal, a data initialization signal, an initialization voltage, an emission control signal, and a power supply voltage. The external device and the display structure 301 may be electrically connected to each other through a printed circuit board (PCB), a flexible printed circuit board (FPCB), a flexible flat cable (FFC), or the like.

The sensing structure 302 may be disposed on the display structure 301. For example, the sensing structure 302 may be substantially transparent. The image may pass through the sensing structure 302. The sensing structure 302 may include sensing electrodes (first sensing electrodes 382 and second sensing electrodes 384 of FIG. 5). The sensing structure 302 may sense a portion of a user body or an object, which is located over the first surface S1 of the display device 100, through the sensing electrodes. In other words, the external device may generate a sensing signal, and the sensing signal generated from the external device may be transmitted to the sensing electrodes through the signal transmission film 500. The external device may sense the portion of the user body or the object located over the front surface of the display device 100 by receiving the sensing signal transmitted to the sensing electrodes. In the exemplary embodiments, the sensing electrode of the sensing structure 302 may include a proximity sensor electrode for sensing proximity of a user or an object with respect to the first surface S1 of the display device 100, or a touch sensor electrode for sensing a touch of a portion of a user body.

The protective member 303 may be disposed on the sensing structure 302. The protective member 303 may be substantially transparent. The image transmitted through the sensing structure 302 may pass through the protective member 303, and the image may be recognized by a user of the display device 100. In addition, even if the protective member 303 is disposed on the sensing structure 302, the sensing structure 302 may sense the portion of the user body or the object on the protective member 303. The protective member 303 may protect the display structure 301 and the sensing structure 302. The protective member 303 may include tempered glass, reinforced plastic, and the like.

The signal transmission film 500 may be connected to one side of the display panel 300. As described above, the signal transmission film 500 may be connected to the sensing structure 302. For example, the sensing signal generated from the external device may be transmitted to the sensing structure 302 through the signal transmission film 500, and the sensing signal transmitted to the sensing structure 302 may be transmitted to the external device through the signal transmission film 500. After the signal transmission film 500 is connected to the one side (e.g., the sensing structure 302) of the display panel 300 as shown in FIG. 1, the signal transmission film 500 may be bent about an axis extending in a first direction D1 as shown in FIG. 2. In this case, the signal transmission film 500 may be located on the second surface S2 of the display device 100.

Figure 4:
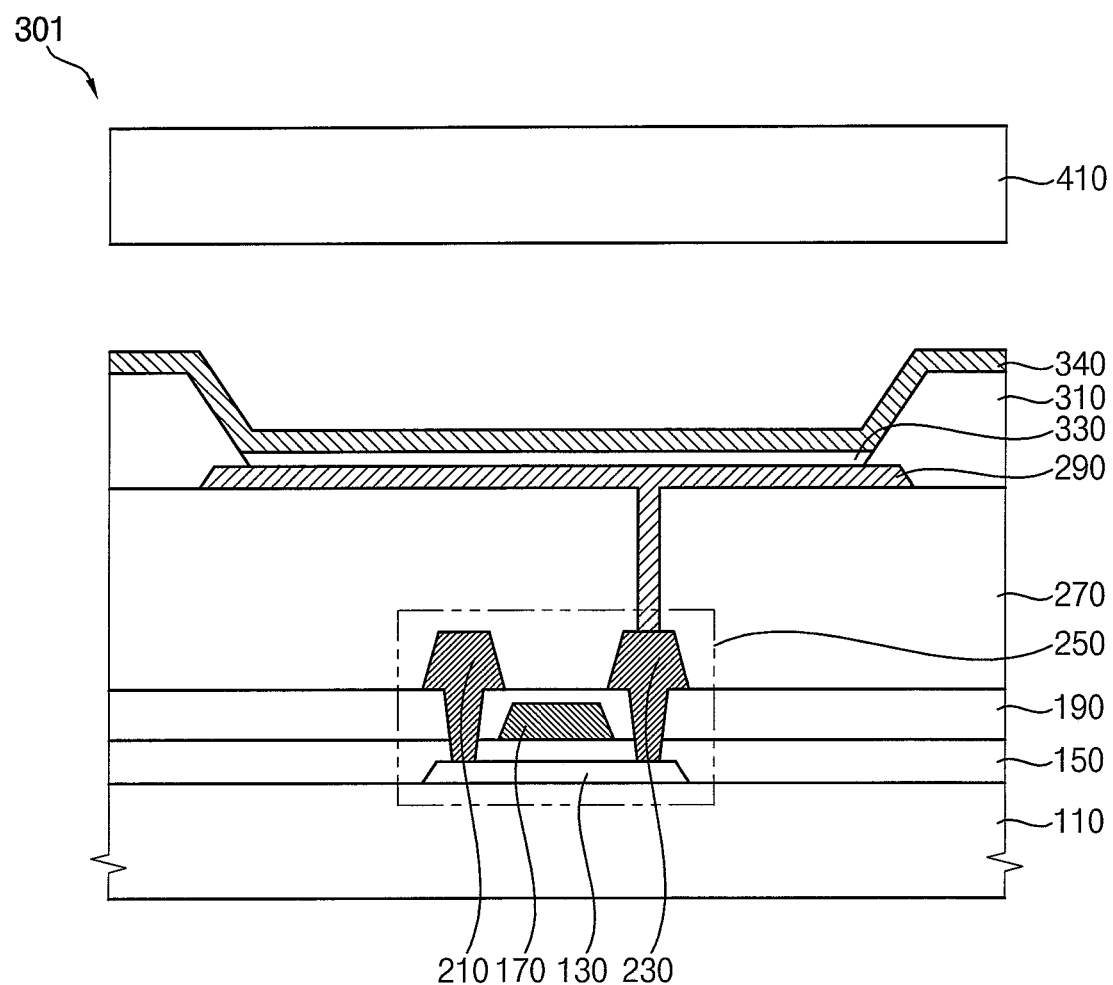
FIG. 4 is a cross-sectional view for describing a light emitting structure included in the display panel of FIG. 3.

FIG. 4 is a cross-sectional view for describing a light emitting structure included in the display panel of FIG. 3.

In FIG. 4, the display structure 301 may include a substrate 110, a semiconductor element 250, a planarization layer 270, a lower electrode 290, a pixel defining layer 310, a light emitting layer 330, an upper electrode 340, an encapsulation substrate 410, and the like. The semiconductor element 250 may include an active layer 130, a gate insulating layer 150, a gate electrode 170, an insulating interlayer 190, a source electrode 210, and a drain electrode 230.

The substrate 110 including a transparent or opaque material may be provided. The substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like.

In some embodiments, the substrate 110 may be a transparent resin substrate having flexibility. Examples of the transparent resin substrate that may be used as the substrate 110 include a polyimide substrate. In this case, the polyimide substrate may include a first polyimide layer, a barrier film layer, a second polyimide layer, and the like. For example, the polyimide substrate may have a configuration in which the first polyimide layer, the barrier film layer, and the second polyimide layer are sequentially stacked on a rigid glass substrate. In a method of manufacturing the display device 100, after an insulating layer (e.g., a buffer layer) is disposed on the second polyimide layer of the polyimide substrate, an upper structure (e.g., the semiconductor element 250, the lower electrode 290, the light emitting layer 330, the upper electrode 340, etc.) may be disposed on the insulating layer. After the upper structure is formed, the rigid glass substrate may be removed. In other words, since the polyimide substrate is thin and flexible, it may be difficult to directly form the upper structure on the polyimide substrate. Taking such facts into consideration, the upper structure is formed by using the rigid glass substrate, and then the glass substrate is removed, so that the polyimide substrate may be used as the substrate 110.

The active layer 130 may be disposed on the substrate 110, and may include a metal oxide semiconductor, an inorganic semiconductor (e.g., amorphous silicon or poly silicon semiconductor), an organic semiconductor, or the like. The active layer 130 may include a channel region, a source region, and a drain region.

The gate insulating layer 150 may be disposed on the active layer 130. The gate insulating layer 150 may be disposed over the substrate 110 to cover the active layer 130 on the substrate 110. The gate insulating layer 150 may sufficiently cover the active layer 130 on the substrate 110, and may have a substantially flat top surface without creating a step around the active layer 130. In some embodiments, the gate insulating layer 150 may be disposed along a profile of the active layer 130 with a uniform thickness to cover the active layer 130 on the substrate 110. The gate insulating layer 150 may include a silicon compound, metal oxide, and the like. In other exemplary embodiments, the gate insulating layer 150 may have a multilayer structure including a plurality of insulating layers. For example, the insulating layers may have mutually different thicknesses or may include mutually different materials.

The gate electrode 170 may be disposed on a portion of the gate insulating layer 150 (e.g., the channel region of the active layer 130) under which the active layer 130 is located. The gate electrode 170 may include a metal, an alloy, metal nitride, conductive metal oxide, a transparent conductive material, and the like. These may be used alone or in combination with each other. In other exemplary embodiments, the gate electrode 170 may have a multilayer structure including a plurality of metal layers. For example, the metal layers may have mutually different thicknesses or may include mutually different materials.

The insulating interlayer 190 may be disposed on the gate electrode 170. The insulating interlayer 190 may be disposed over the gate insulating layer 150 to cover the gate electrode 170 on the gate insulating layer 150. The insulating interlayer 190 may sufficiently cover the gate electrode 170 on the gate insulating layer 150, and may have a substantially flat top surface without creating a step around the gate electrode 170. In some embodiments, the insulating interlayer 190 may be disposed along a profile of the gate electrode 170 with a uniform thickness to cover the gate electrode 170 on the gate insulating layer 150. The insulating interlayer 190 may include a silicon compound, metal oxide, and the like. In other exemplary embodiments, the insulating interlayer 190 may have a multilayer structure including a plurality of insulating layers. For example, the insulating layers may have mutually different thicknesses or may include mutually different materials.

The source electrode 210 and the drain electrode 230 may be disposed on the insulating interlayer 190. The source electrode 210 may be connected to the source region of the active layer 130 through a contact hole formed by removing first portions of the gate insulating layer 150 and the insulating interlayer 190, and the drain electrode 230 may be connected to the drain region of the active layer 130 through a contact hole formed by removing second portions of the gate insulating layer 150 and the insulating interlayer 190. Each of the source electrode 210 and the drain electrode 230 may include a metal, an alloy, metal nitride, conductive metal oxide, a transparent conductive material, and the like. These may be used alone or in combination with each other. In other exemplary embodiments, each of the source electrode 210 and the drain electrode 230 may have a multilayer structure including a plurality of metal layers. For example, the metal layers may have mutually different thicknesses or may include mutually different materials.

Accordingly, the semiconductor element 250 including the active layer 130, the gate insulating layer 150, the gate electrode 170, the insulating interlayer 190, the source electrode 210, and the drain electrode 230 may be provided.

Although the display device 100 has been described as having a configuration including one transistor (e.g., the semiconductor element 250), the configuration of the present invention is not limited thereto. For example, the display device 100 may have a configuration including at least two transistors and at least one capacitor.

In addition, although the semiconductor element 250 has been described as having a top gate structure, the configuration of the present invention is not limited thereto. For example, the semiconductor element 250 may have a bottom gate structure and/or a double gate structure.

The planarization layer 270 may be disposed on the insulating interlayer 190, the source electrode 210, and the drain electrode 230. For example, the planarization layer 270 may have a relatively thick thickness to sufficiently cover the source and drain electrodes 210 and 230, respectively, on the insulating interlayer 190. In this case, the planarization layer 270 may have a substantially flat top surface. In order to implement such a flat top surface of the planarization layer 270, a planarization process may be additionally performed on the planarization layer 270. A portion of a top surface of the drain electrode 230 may be exposed through a contact hole formed by removing a portion of the planarization layer 270. The planarization layer 270 may include an organic material or an inorganic material. In the exemplary embodiment, the planarization layer 270 may include an organic material.

The lower electrode 290 may be disposed on the planarization layer 270. The lower electrode 290 may pass through the contact hole of the planarization layer 270 so as to be connected to the drain electrode 230. In addition, the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In other exemplary embodiments, the lower electrode 290 may have a multilayer structure including a plurality of metal layers. For example, the metal layers may have mutually different thicknesses or may include mutually different materials.

The pixel defining layer 310 may be disposed on a portion of the lower electrode 290 and the planarization layer 270. The pixel defining layer 310 may cover both sides of the lower electrode 290, and may expose a portion of a top surface of the lower electrode 290. The pixel defining layer 310 may be formed of an organic material or an inorganic material. In the exemplary embodiments, the pixel defining layer 310 may include an organic material.

The light emitting layer 330 may be disposed on the lower electrode 290 exposed by the pixel defining layer 310. The light emitting layer 330 may be formed by using at least one of light emitting materials for emitting different color lights (i.e., red light, green light, blue light, etc.) according to pixels. Alternatively, the light emitting layer 330 may be formed by stacking a plurality of light emitting materials for generating different color lights such as red light, green light, and blue light to emit white light as a whole. In this case, a color filter may be disposed on the light emitting layer 330 (to overlap the light emitting layer 330 on a bottom surface or a top surface of the encapsulation substrate 410). The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the pixel defining layer 310 and the light emitting layer 330. The upper electrode 340 may include a metal, an alloy, metal nitride, conductive metal oxide, a transparent conductive material, and the like. These may be used alone or in combination with each other. In other exemplary embodiments, the upper electrode 340 may have a multilayer structure including a plurality of metal layers. For example, the metal layers may have mutually different thicknesses or may include mutually different materials.

The encapsulation substrate 410 may be disposed on the upper electrode 340. The encapsulation substrate 410 may face the substrate 110. The encapsulation substrate 410 may include substantially the same material as the substrate 110. For example, the encapsulation substrate 410 may include a quartz substrate, a synthetic quartz substrate, a calcium fluoride substrate, an F-doped quartz substrate, a soda lime glass substrate, a non-alkali glass substrate, and the like. In other exemplary embodiments, the encapsulation substrate 410 may include a transparent inorganic material or flexible plastic. For example, the encapsulation substrate 410 may include a transparent resin substrate having flexibility. In this case, in order to improve flexibility of the display structure 301, a structure in which at least one inorganic layer and at least one organic layer are alternately stacked may be provided. The stacked structure may include a first inorganic layer, an organic layer, and a second inorganic layer. For example, the first inorganic layer having flexibility may be disposed along a profile of the upper electrode 340, the organic layer having flexibility may be disposed on the first inorganic layer, and the second inorganic layer having flexibility may be disposed on the organic layer. In other words, the stacked structure may correspond to a thin film encapsulation structure making direct contact with the upper electrode 340.

Accordingly, the display structure 301 including the substrate 110, the semiconductor element 250, the planarization layer 270, the lower electrode 290, the pixel defining layer 310, the light emitting layer 330, the upper electrode 340, and the encapsulation substrate 410 may be provided.

Figure 5:
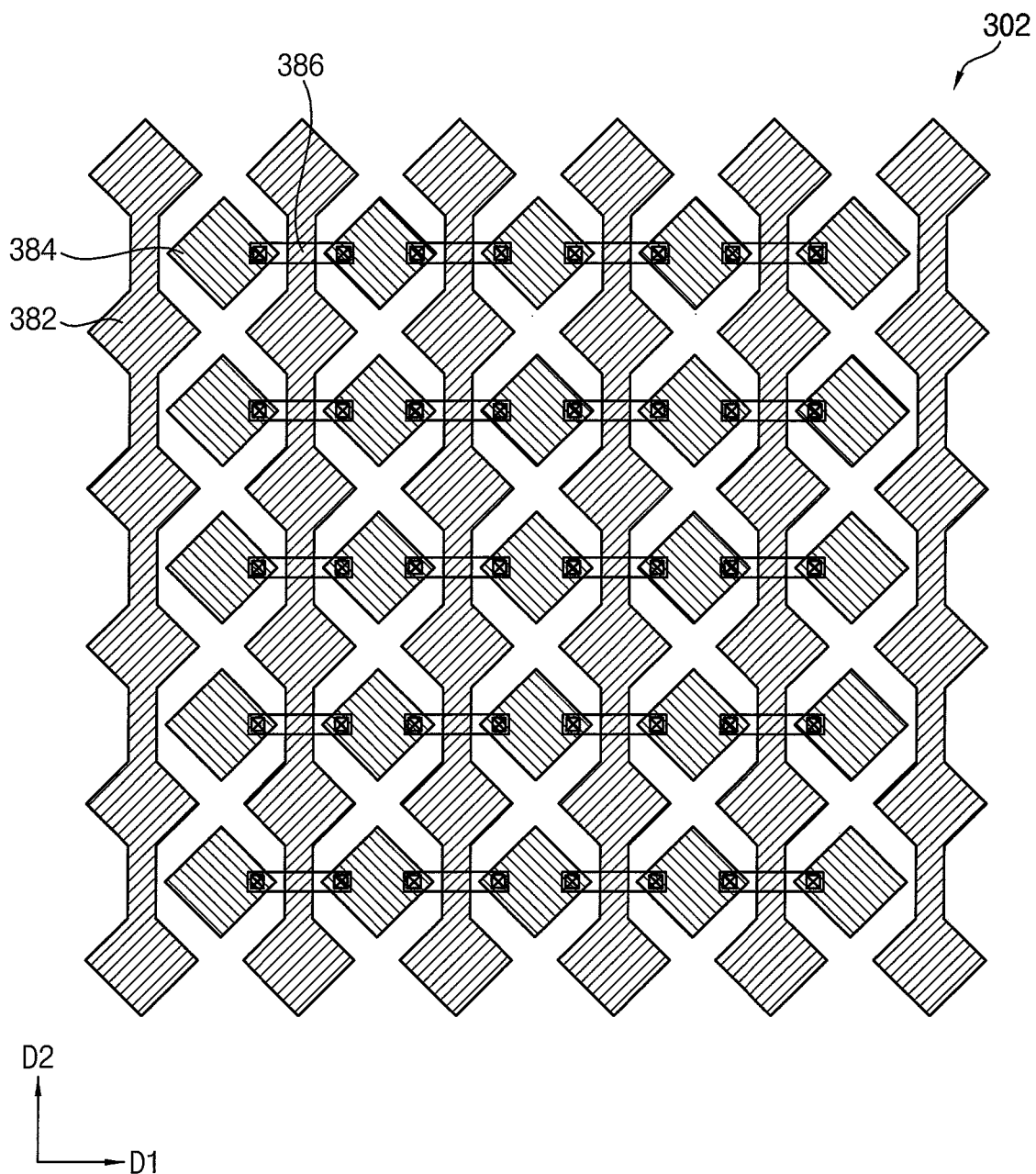
FIG. 5 is a cross-sectional view for describing a sensing structure included in the display panel of FIG. 3.

FIG. 5 is a cross-sectional view for describing a sensing structure included in the display panel of FIG. 3.

Referring to FIG. 5, the sensing structure 302 may include first sensing electrodes 382, second sensing electrodes 384, and connection electrodes 386. For example, the first sensing electrodes 382 and the second sensing electrodes 384 may be disposed on the encapsulation substrate 410. In some embodiments, an insulating layer may be disposed between the encapsulation substrate 410 and the first and second sensing electrodes 382 and 384. Each of the first sensing electrodes 382 may extend in a second direction D2 (e.g., a direction perpendicular to the first direction D1), and may be spaced apart from each other in the first direction D1. The second sensing electrodes 384 may be spaced apart from each other in the second direction D2 between two adjacent first sensing electrodes 382 among the first sensing electrodes 382. For example, each of the first and second sensing electrodes 382 and 384 may include carbon nano-tubes (CNT), transparent conductive oxide, indium tin oxide (ITO), indium gallium zinc oxide (IGZO), zinc oxide (ZnO), graphene, Ag nano-wire (AgNW), copper (Cu), chromium (Cr), and the like.

An insulating layer may be disposed on the first sensing electrodes 382 and the second sensing electrodes 384. The insulating layer may be disposed along a profile of the first and second sensing electrodes 382 and 384 with a uniform thickness to cover the first and second sensing electrodes 382 and 384. The insulating layer may include an organic material or an inorganic material.

The connection electrodes 386 may be disposed on the insulating layer. The connection electrodes 386 may electrically connect two second sensing electrodes 384, which are adjacent to each other in the first direction D1 among the second sensing electrodes 384, through a contact hole formed by removing a portion of the insulating layer. For example, the connection electrodes 386 may include the same material as the first and second sensing electrodes 382 and 384. In some embodiments, the connection electrodes 386 may include a metal, an alloy, metal nitride, conductive metal oxide, a transparent conductive material, and the like. These may be used alone or in combination with each other.

Accordingly, the sensing structure 302 including the first sensing electrodes 382, the second sensing electrodes 384, and the connection electrodes 386 may be provided.

Figure 6:
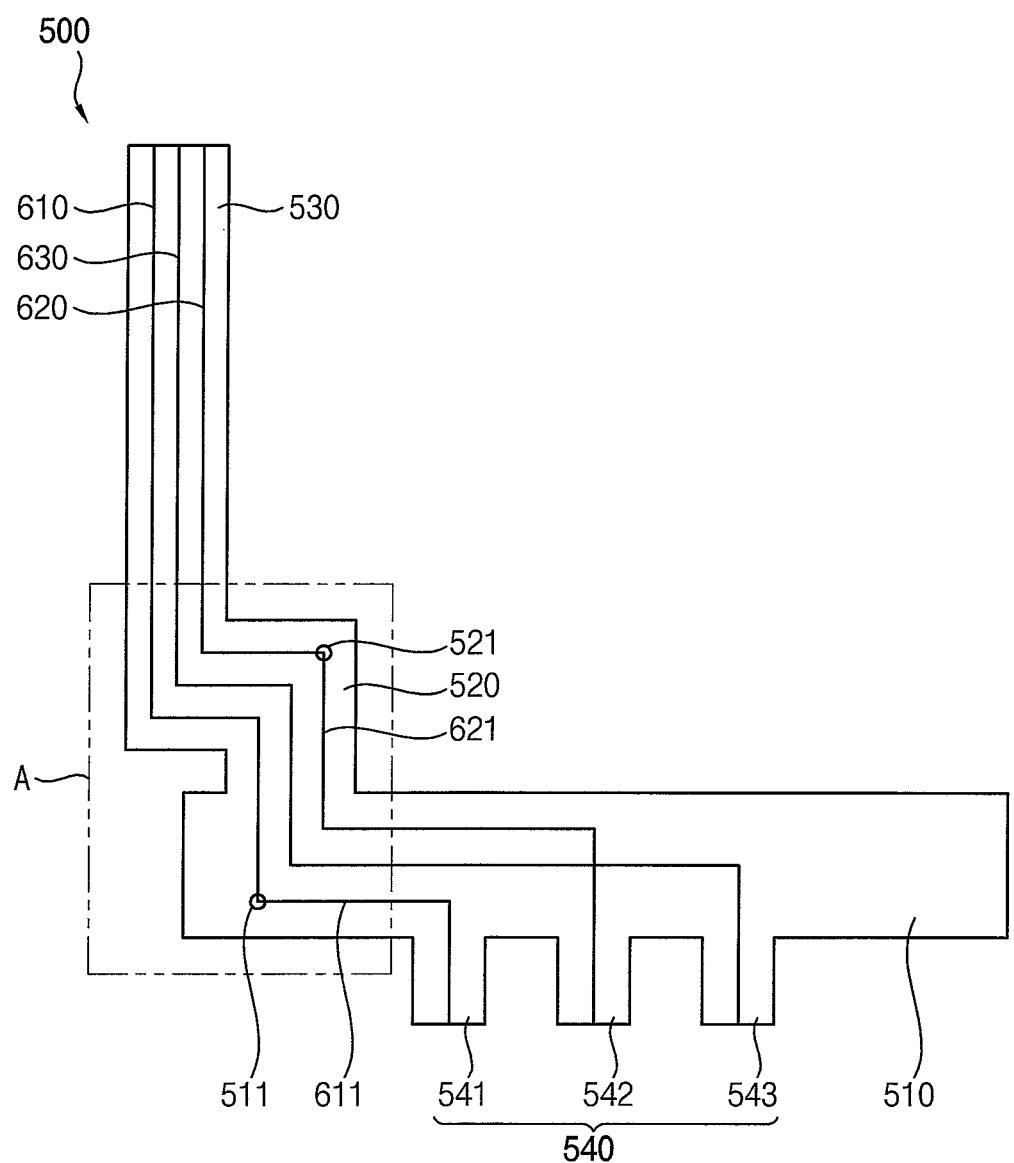
FIG. 6 is a plan view for describing a signal transmission film included in the display device of FIGS. 1 and 2.
Figure 6:
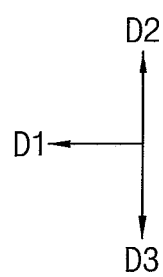
Figure 7:
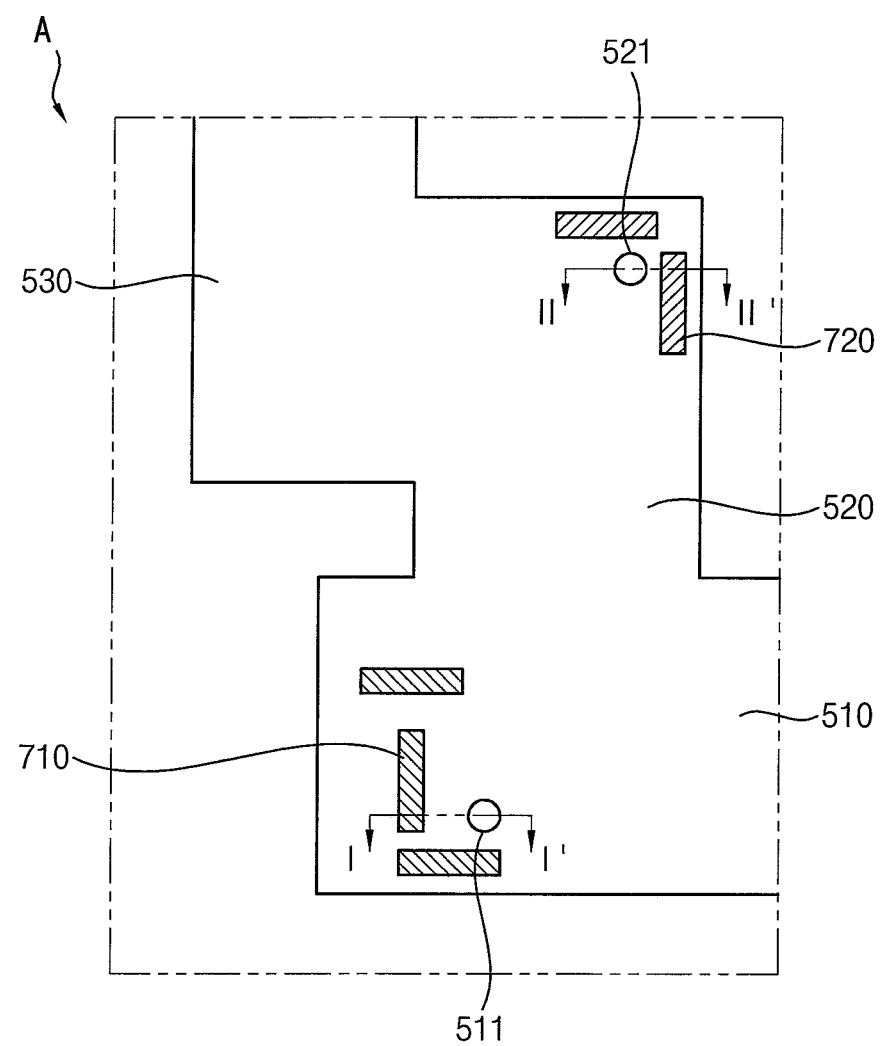
FIG. 7 is a partially enlarged plan view showing 'A' region of FIG. 6.
Figure 7:
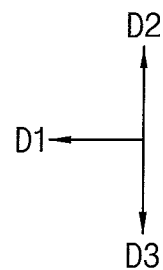

FIG. 6 is a plan view for describing a signal transmission film included in the display device of FIGS. 1 and 2, and FIG. 7 is a partially enlarged plan view showing 'A' region of FIG. 6. For example, FIG. 6 shows the signal transmission film 500 shown in FIG. 2 which is located on the second surface S2 of the display device 100 by bending the signal transmission film 500.

In FIGS. 6 and 7, the signal transmission film 500 may include a first lower wire 610, a first upper wire 611, a second lower wire 620, a second upper wire 621, a third wire 630, first dummy patterns 710, second dummy patterns 720, and the like. In addition, the signal transmission film 500 may further include a first extension portion 510, a second extension portion 520, a third extension portion 530, and fourth extension portions 540. In this case, the fourth extension portions 540 may include a first bending extension portion 541, a second bending extension portion 542, and a third bending extension portion 543.

The first extension portion 510 may extend in the first direction D1, and a first contact hole 511 may be located at a first side of the first extension portion 510 (e.g., a left side of the first extension portion 510). In the exemplary embodiments, the first dummy pattern 710 may be adjacent to the first contact hole 511.

The second extension portion 520 may extend from the first side of the first extension portion 510 in the second direction D2 perpendicular to the first direction D1. A second contact hole 521 may be located at a second side of the second extension portion 520 (e.g., a right side of the second extension portion 520). In the exemplary embodiments, the second dummy pattern 720 may overlap the second contact hole 521.

The third extension portion 530 may extend from a side of the second extension portion 520 (e.g., a left side of the second extension portion 520) in the second direction D2. A distal end of the third extension portion 530 (e.g., a portion opposite to an end of the third extension portion 530 which is adjacent to the second extension portion 520) may be electrically connected to the external device to receive a sensing voltage from the external device. The received sensing voltage may be applied to first portions of the first lower wire 610, the second lower wire 620, and the third wire 630 disposed in the third extension portion 530. In other words, the distal end of the third extension portion 530 may correspond to a signal input portion of the signal transmission film 500.

The fourth extension portions 540 may protrude from a central portion of the first extension portion 510 (e.g., a portion located in a direction opposite to the first direction D1 from the first side of the first extension portion 510) in the second direction D2 perpendicular to the first direction D1. The first bending extension portion 541 may be located on a left side of the second bending extension portion 542, the third bending extension portion 543 may be located on a right side of the second bending extension portion 542, and the second bending extension portion 542 may be located between the first bending extension portion 541 and the third bending extension portion 543. In addition, the first, second, and third bending extension portions 541, 542, and 543 may be connected to the sensing structure 302, and may be bent along the axis extending in the first direction D1. The sensing voltage applied to the first lower wire 610, the second lower wire 620, and the third wire 630 may be transmitted to second portions of the first upper wire 611 disposed in the first bending extension portion 541, the second upper wire 621 disposed in the second bending extension portion 542, and the third wire 630 disposed in the third bending extension portion 543. In other words, the fourth extension portions 540 may correspond to signal output portions of the signal transmission film 500, and the sensing voltage transmitted to the second portions of the first upper wire 611, the second upper wire 621, and the third wire 630 may be provided to the sensing structure 302.

Figure 8A:
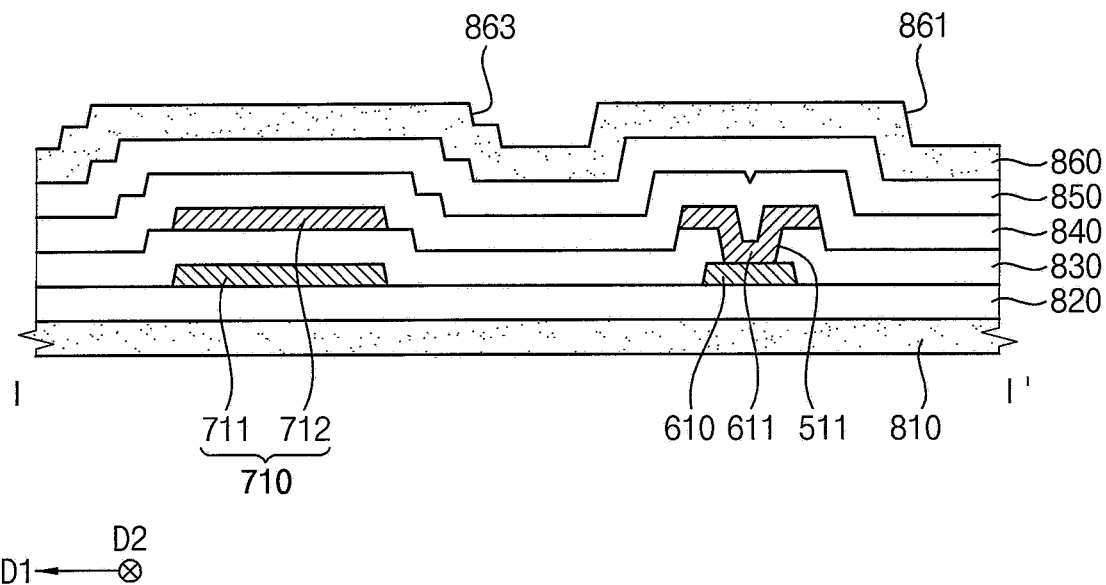
FIG. 8A is a cross-sectional view taken along line I-I' of FIG. 7.

The first lower wire 610 may be disposed in the third extension portion 530, the second extension portion 520, and the first side of the first extension portion 510. The first upper wire 611 may be disposed in the first side of the first extension portion 510 and the first bending extension portion 541. In the exemplary embodiments, the first lower wire 610 and the first upper wire 611 may be located on different layers, and may be connected to each other through a first contact hole 511 located at the first side of the first extension portion 510. For example, a first end of the first lower wire 610 may be located at the distal end of the third extension portion 530, and a second end opposite to the first end of the first lower wire 610 may be located in the first contact hole 511. A first end of the first upper wire 611 may be located in the first contact hole 511, and a second end opposite to the first end of the first upper wire 611 may be located in the first bending extension portion 541. In the exemplary embodiments, as shown in FIG. 8A, the first lower wire 610 and the first upper wire 611 may overlap each other so as to be connected to each other at a portion where the first contact hole 511 is located, and the portion where the first contact hole 511 is located may have a first step 861 which protrudes further than a periphery thereof.

Figure 8B:
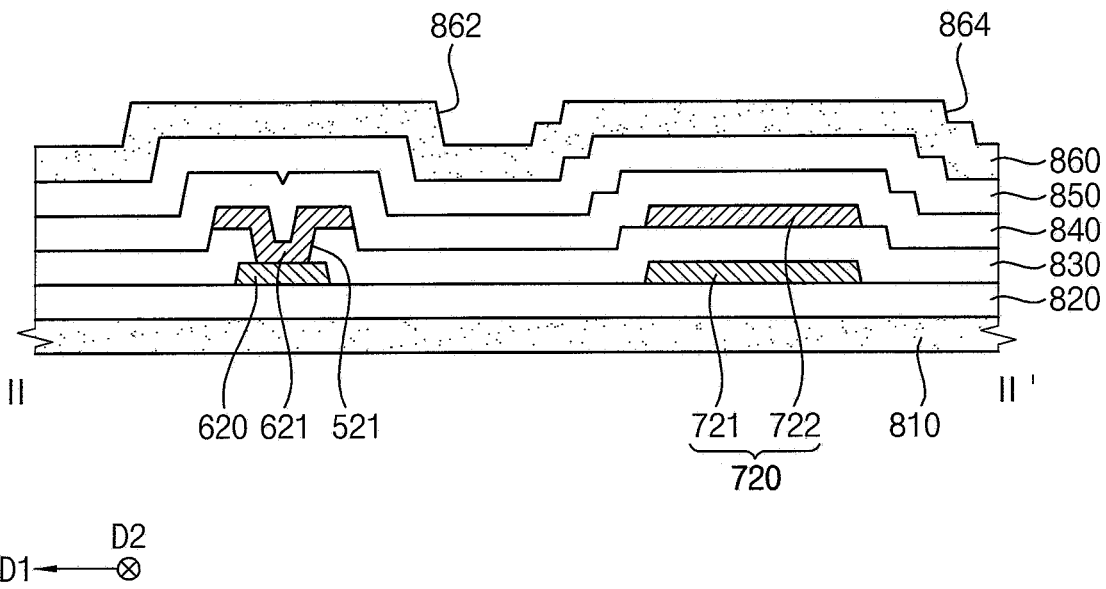
FIG. 8B is a cross-sectional view taken along line II-II' of FIG. 7.

The second lower wire 620 may be disposed in the third extension portion 530 and the second side of the second extension portion 520. The second upper wire 621 may be disposed in the second side of the second extension portion 520, the first extension portion 510, and the second bending extension portion 542. In the exemplary embodiments, the second lower wire 620 and the second upper wire 621 may be located on different layers, and may be connected to each other through a second contact hole 521 located at the second side of the second extension portion 520. For example, a first end of the second lower wire 620 may be located at the distal end of the third extension portion 530, and a second end opposite to the first end of the second lower wire 620 may be located in the second contact hole 521. A first end of the second upper wire 621 may be located in the second contact hole 521, and a second end opposite to the first end of the second upper wire 621 may be located in the second bending extension portion 542. In the exemplary embodiments, as shown in FIG. 8B, the second lower wire 620 and the second upper wire 621 may overlap each other so as to be connected to each other at a portion where the second contact hole 521 is located, and the portion where the second contact hole 521 is located may have a second step 862 which protrudes further than a periphery thereof.

The third wire 630 may be disposed in the third extension portion 530, the second extension portion 520, the first extension portion 510, and the third bending extension portion 543. In the exemplary embodiments, the third wire 630 may not overlap the first lower wire 610 and the second lower wire 620 in the third extension portion 530, and the third wire 630 may partially overlap the first upper wire 611 or the second upper wire 621 in the second extension portion 520 and the first extension portion 510 (e.g., a portion of the third wire 630 and the second upper wire 621 may intersect each other at a portion adjacent to the second bending extension portion 542). In addition, the third wire 630, the first lower wire 610, and the second lower wire 620 may be located on the same layer, and may be spaced apart from each other. Moreover, the third wire 630, the first upper wire 611, and the second upper wire 621 may be located on different layers.

Accordingly, the signal transmission film 500 including the first extension portion 510, the second extension portion 520, the third extension portion 530, the fourth extension portions 540, the first lower wire 610, the first upper wire 611, the second lower wire 620, the second upper wire 621, the third wire 630, and the like may be provided. In this case, the first extension portion 510, the second extension portion 520, the third extension portion 530, and the fourth extension portions 540 may be connected to and integrally formed with each other.

Although each of the first lower wire 610, the first upper wire 611, the second lower wire 620, the second upper wire 621, and the third wire 630 has been described as including one wire, the configuration of the present invention is not limited thereto. For example, each of the first upper wire 611, the second lower wire 620, the second upper wire 621, and the third wire 630 may include a plurality of wires. In this case, each of the first contact hole 511 and the second contact hole 521 may include a plurality of contact holes.

As shown in FIG. 7, the first dummy patterns 710 may be adjacent to the first contact hole 511. For example, the first dummy patterns 710 may be disposed in the first extension portion 510. The first dummy patterns 710 may not overlap the first lower wire 610, the second lower wire 620, the first upper wire 611, the second upper wire 621, and the third wire 630. In the exemplary embodiments, as shown in FIG. 8A, the first dummy pattern 710 may be spaced apart from the portion where the first contact hole 511 is located in the first direction D1, and a portion where the first dummy pattern 710 is disposed may have a third step 863 which protrudes more than a periphery thereof.

The second dummy patterns 720 may be adjacent to the second contact hole 521. For example, the second dummy patterns 720 may be disposed in the second extension portion 520. The second dummy patterns 720 may not overlap the first lower wire 610, the second lower wire 620, the first upper wire 611, the second upper wire 621, and the third wire 630. In the exemplary embodiments, as shown in FIG. 8B, the second dummy pattern 720 may be spaced apart from the portion where the second contact hole 521 is located in a direction opposite to the first direction D1, and a portion where the second dummy pattern 720 is disposed may have a fourth step 864 which protrudes further than a periphery thereof.

Levels of top surfaces (e.g., heights from a top surface of the lower substrate 810 to the top surfaces) of the first step 861 formed in the portion where the first contact hole 511 is located, the second step 862 formed in the portion where the second contact hole 521 is located, the third step 863 formed in the portion where the first dummy pattern 710 is disposed, and the fourth step 864 formed in the portion where the second dummy pattern 720 is disposed may be substantially the same. In other words, the display device 100 includes the first dummy patterns 710 and the second dummy patterns 720, so that the third steps 863 and the fourth steps 864 may be formed in the portions adjacent to the portions where the first step 861 and the second step 862 are formed, respectively.

Figure 10:
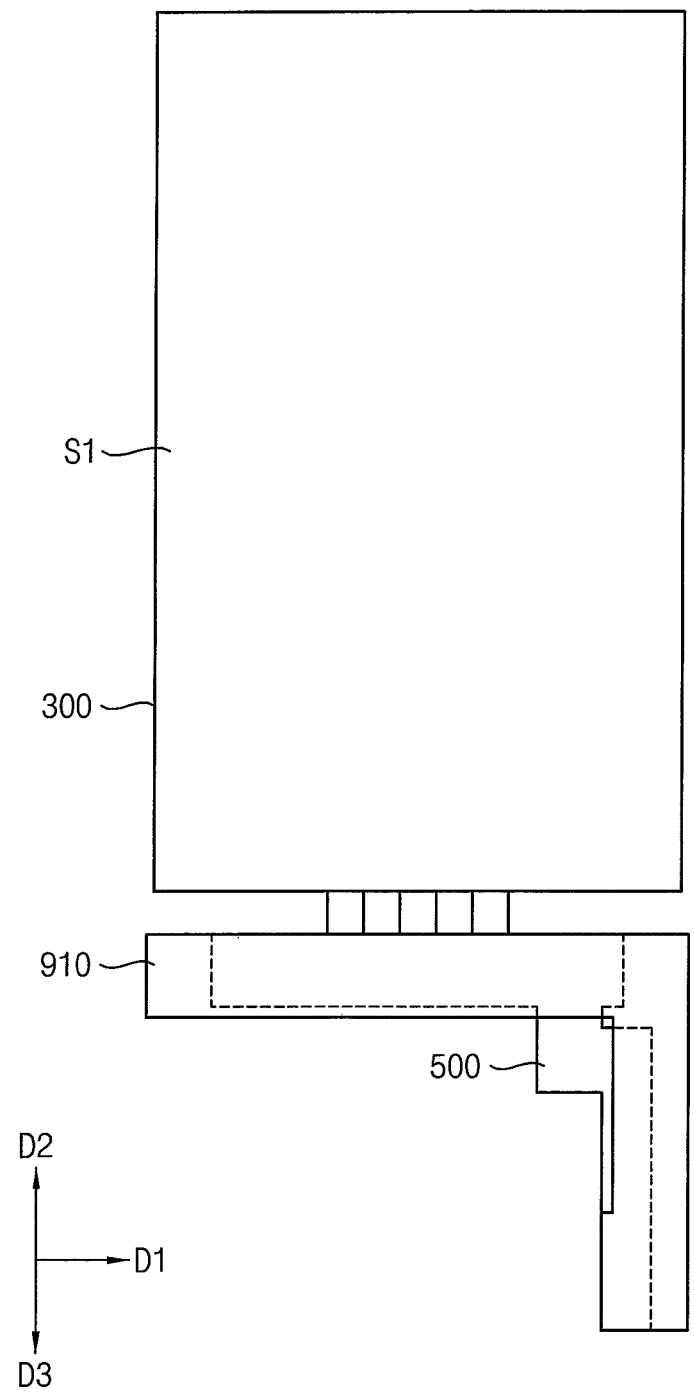
FIGS. 10, 11, 12, and 13 are plan views showing a method of manufacturing a display device according to embodiments of the inventive concepts.
Figure 11:
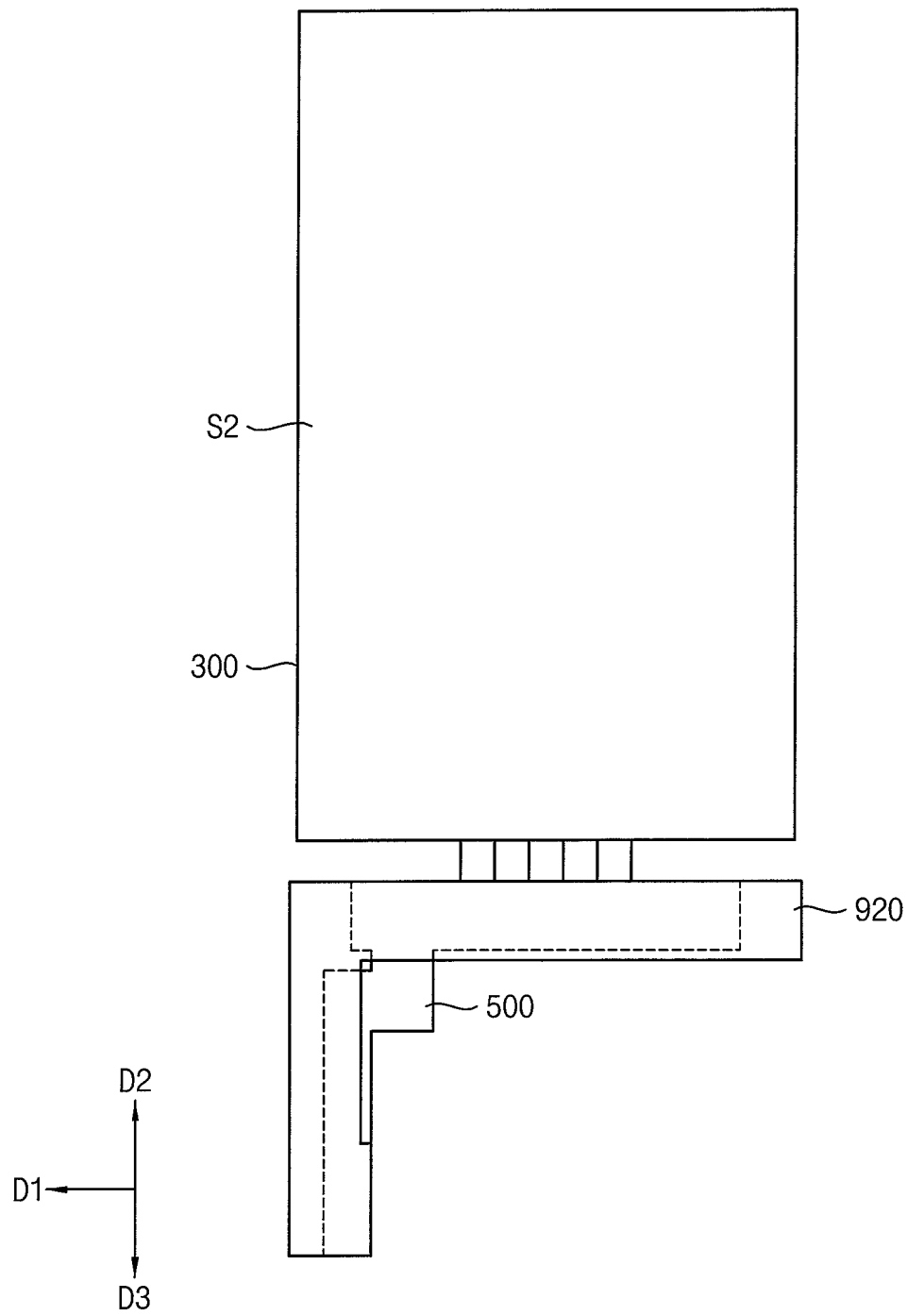
Figure 12:
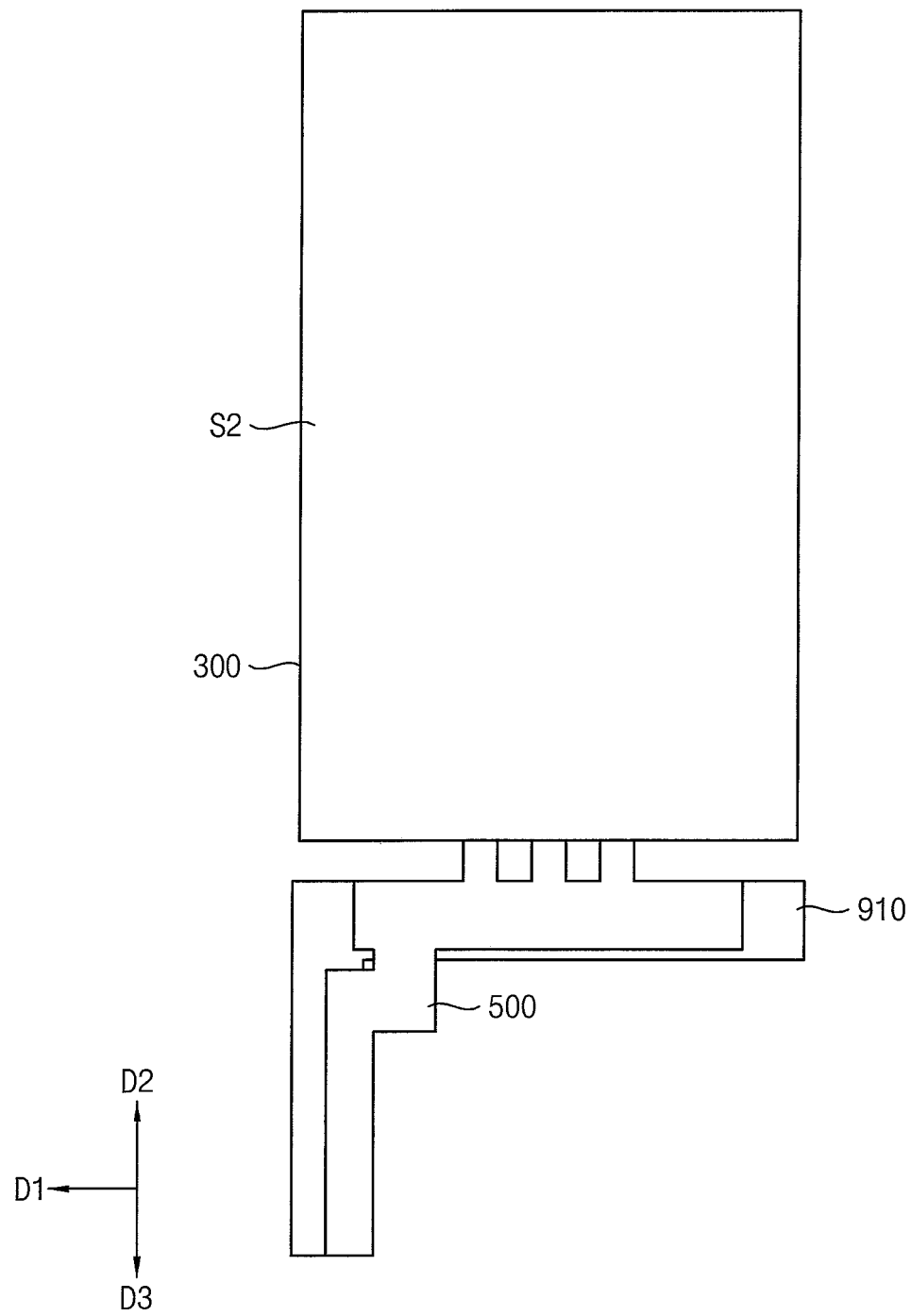
Figure 13:
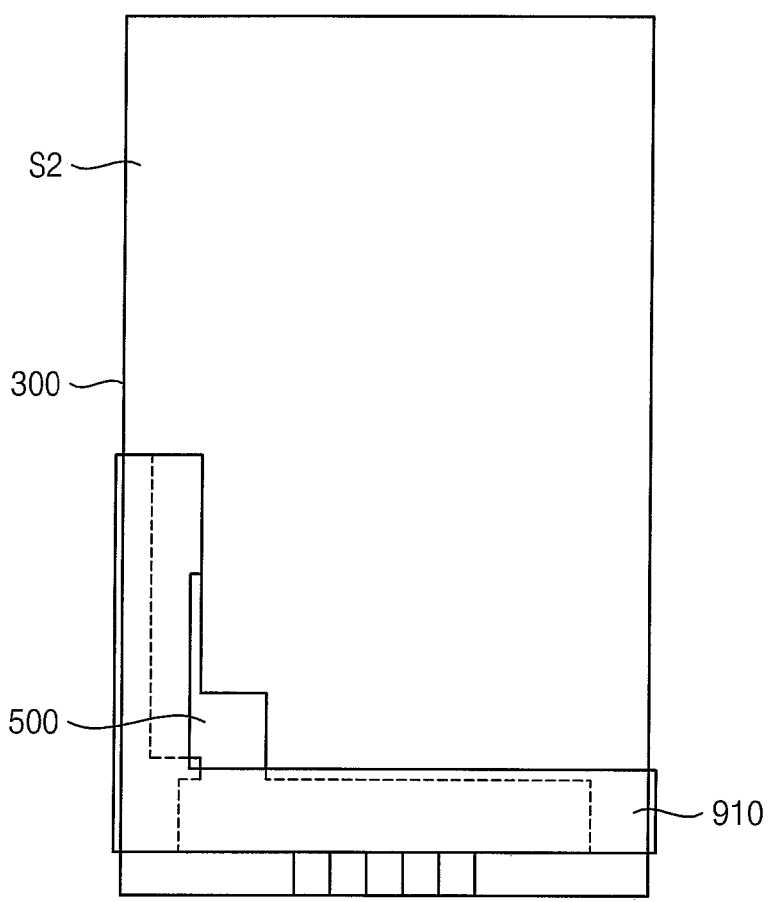
Figure 13:
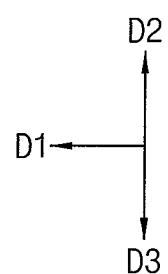

In a process of manufacturing a conventional display device 100, protective films (e.g., release paper or a liner) for protecting the signal transmission film 500 may be disposed on top and bottom surfaces of the signal transmission film 500, and the signal transmission film 500 onto which the protective films are attached may be connected to the display panel 300 (see FIGS. 10 and 11). For example, as shown in FIG. 10, before the signal transmission film 500 is bent, an upper protective film 910 may be located on the top surface of the signal transmission film 500 which is parallel to the first surface S1 of the display device 100. In addition, as shown in FIG. 11, before the signal transmission film 500 is bent, a lower protective film 920 may be located on the bottom surface of the signal transmission film 500 which is parallel to the second surface S2 of the display device 100. As shown in FIG. 12, after the signal transmission film 500 onto which the upper protective film 910 and the lower protective film 920 are attached, is connected to the display panel 300, the lower protective film 920 may be removed from the bottom surface of the signal transmission film 500. As shown in FIG. 13, after the lower protective film 920 is removed, the fourth extension portions 540 may be bent along the axis extending in the first direction D1. In this case, a bending axis of the signal transmission film 500 may correspond to the fourth extension portions 540, and a bending axis of the upper protective film 910 may be a portion adjacent to the first side of the first extension portion 510 of the signal transmission film 500. For example, a portion of the upper protective film 910 which overlaps the third extension portion 530 may be fixed to manufacturing equipment, so that the signal transmission film 500 onto which the upper protective film 910 is attached may be bent.

In order to arrange a plurality of wires in a limited space of the signal transmission film 500, the first lower wire 610 and the first upper wire 611 may be connected to each other through the first contact hole 511, and the second lower wire 620 and the second upper wire 621 may be connected to each other through the second contact hole 521. However, in order to connect the lower wire (e.g., the first lower wire 610 or the second lower wire 620) to the upper wire (e.g., the first upper wire 611 or the second upper wire 621), a portion of the lower wire and a portion of the upper wire have to overlap each other, and a portion where the wires overlap may have a step which protrudes further than a periphery thereof. In this case, the bending axis of the signal transmission film 500 and the bending axis of the upper protective film 910 may be different from each other, and adhesion between the upper protective film 910 and the signal transmission film 500 may be relatively low at the first side due to the first steps formed on the first side (see FIG. 9). Therefore, in the bending process, the upper protective film 910 may be separated from the signal transmission film 500 at the first side, and the signal transmission film 500 may be inclined on the second surface S2 of the display device 100. In other words, after the signal transmission film 500 is bent, misalignment of the signal transmission film 500 may occur.

The display device 100 according to the exemplary embodiments of the present invention includes the first dummy patterns 710 and the second dummy patterns 720, so that the third steps 863 and the fourth steps 864 may be formed around the first step 861 and the second step 862, respectively. Accordingly, the upper protective film 910 may additionally make contact with the third steps 863 and the fourth steps 864, and the adhesion between the upper protective film 910 and the signal transmission film 500 may be relatively increased at the first side. In other words, while the signal transmission film 500 is bent, the upper protective film 910 and the signal transmission film 500 may not be separated from each other at the first side, and the misalignment of the signal transmission film 500 may be prevented.

In the present invention, although the first contact hole 511 and the first dummy patterns 710 have been described as being located only at the first side, and the second contact hole 521 and the second dummy patterns 720 have been described as being located only at the second side, the configuration of the present invention is not limited thereto. For example, a contact hole in which the upper and lower wires are connected to each other may be formed in at least some of the first extension portion 510, the second extension portion 520, the third extension portion 530, and the fourth extension portions 540, and dummy patterns may be disposed around the contact hole.

Figure 9:
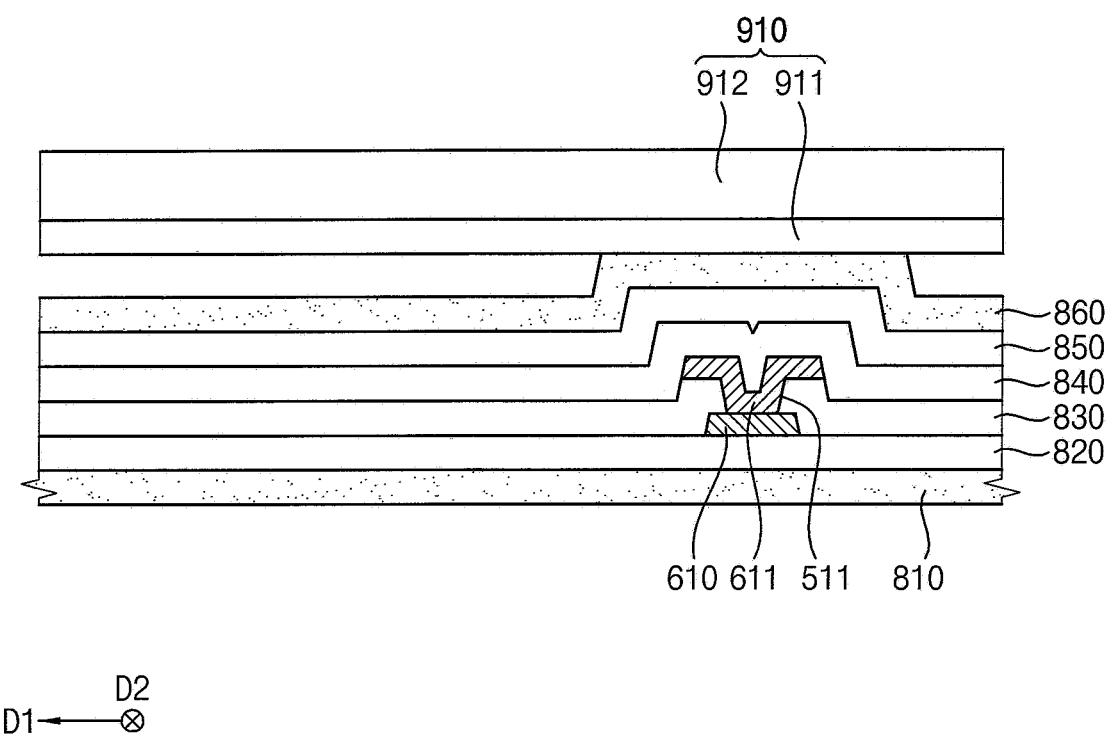
FIG. 9 is a cross-sectional view for describing a signal transmission film included in a conventional display device.

FIG. 8A is a cross-sectional view taken along line I-I' of FIG. 7, FIG. 8B is a cross-sectional view taken along line II-II' of FIG. 7, FIG. 9 is a cross-sectional view for describing a signal transmission film included in a conventional display device.

In FIGS. 8A and 8B, the signal transmission film 500 may include a lower substrate 810, a lower insulating layer 820, a first insulating layer 830, a second insulating layer 840, an upper insulating layer 850, an upper substrate 860, a first lower wire 610, a first upper wire 611, a second lower wire 620, a second upper wire 621, a third wire 630, a first dummy pattern 710, the second dummy pattern 720, and the like. In this case, the first dummy pattern 710 may include a first lower dummy pattern 711 and a first upper dummy pattern 712, and the second dummy pattern 720 may include a second lower dummy pattern 721 and a second upper dummy pattern 722.

The lower substrate 810 may be provided. The lower substrate 810 may include polyimide (PI), polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), urethane, thermoplastic polyurethane (TPU), and the like. The lower substrate 810 may further include a light blocking material to have a black color. The light blocking material may include carbon black, titanium nitride oxide, titanium black, phenylene black, aniline black, cyanine black, nigrosine acid black, black resin, and the like.

The lower insulating layer 820 may be disposed on the lower substrate 810. The lower insulating layer 820 may be disposed over the lower substrate 810. The lower insulating layer 820 may include an organic insulating material such as a photoresist, a polyacryl-based resin, a polyimide-based resin, a polyamide-based resin, a siloxane-based resin, an acryl-based resin, and an epoxy-based resin.

The first lower wire 610 may be disposed at the first side of the first extension portion 510 on the lower insulating layer 820. The first lower wire 610 may be disposed in the third extension portion 530, the second extension portion 520, and the first side of the first extension portion 510 on the lower insulating layer 820. In the exemplary embodiments, the first lower wire 610 may at least partially overlap the first upper wire 611 at the first side. In addition, the first lower wire 610 may not be provided in a remaining portion except for the first side of the first extension portion 510.

The second lower wire 620 may be disposed at the second side of the second extension portion 520 on the lower insulating layer 820. The second lower wire 620 may be disposed in the third extension portion 530 and the second side of the second extension portion 520 on the lower insulating layer 820. In the exemplary embodiments, the second lower wire 620 may at least partially overlap the second upper wire 621 at the first side. In addition, the second lower wire 620 may not be provided in a remaining portion except for the second side of the second extension portion 520.

The first lower dummy pattern 711 may be disposed at the first side while being spaced apart from the first lower wire 610 on the lower insulating layer 820, and the second lower dummy pattern 721 may be disposed at the second side while being spaced apart from the second lower wire 620 on the lower insulating layer 820.

The third wire 630 (see FIG. 6) may be spaced apart from the first lower wire 610, the second lower wire 620, the first lower dummy pattern 711, and the first upper dummy pattern 712 on the lower insulating layer 820. In the exemplary embodiments, the third wire 630 may not overlap the first lower wire 610 and the second lower wire 620 in the third extension portion 530, and the third wire 630 may partially overlap the first upper wire 611 or the second upper wire 621 in the second extension portion 520 and the first extension portion 510.

Each of the first lower wire 610, the second lower wire 620, the third wire 630, the first lower dummy pattern 711, and the second lower dummy pattern 721 may include a metal, an alloy, metal nitride, conductive metal oxide, a transparent conductive material, and the like. For example, each of the first lower wire 610, the second lower wire 620, the third wire 630, the first lower dummy pattern 711, and the second lower dummy pattern 721 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other exemplary embodiments, each of the first lower wire 610, the second lower wire 620, the third wire 630, the first lower dummy pattern 711, and the second lower dummy pattern 721 may have a multilayer structure including a plurality of metal layers. For example, the metal layers may have mutually different thicknesses or may include mutually different materials.

The first insulating layer 830 may be disposed on the first lower wire 610, the second lower wire 620, the third wire 630, the first lower dummy pattern 711, and the second lower dummy pattern 721. In the exemplary embodiments, the first insulating layer 830 may have a first contact hole 511 which exposes a portion of the first lower wire 610 at the first side, and a second contact hole 521 which exposes a portion of the second lower wire 620 at the second side. In addition, the first insulating layer 830 may not have a contact hole which exposes the third wire 630. The first insulating layer 830 may be disposed along a profile of the first lower wire 610, the second lower wire 620, the first lower dummy pattern 711, and the second lower dummy pattern 721 with a uniform thickness to cover the first lower wire 610, the second lower wire 620, the first lower dummy pattern 711, and the second lower dummy pattern 721 on the lower insulating layer 820. The lower insulating layer 820 may include an inorganic insulating material or an organic insulating material such as silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), and titanium oxide ($TiO_x$).

The first upper wire 611 may be disposed in the first contact hole 511. The first upper wire 611 may be disposed in the first side of the first extension portion 510 and the first bending extension portion 541 on the first insulating layer 830. In the exemplary embodiments, the first upper wire 611 may at least partially overlap the first lower wire 610 at the first side. In addition, the first upper wire 611 may not be provided in the second extension portion 520 and the third extension portion 530.

The second upper wire 621 may be disposed in the second contact hole 521. The second upper wire 621 may be disposed in the second side of the second extension portion 520, the first extension portion 510, and the second bending extension portion 542 on the first insulating layer 830. In the exemplary embodiments, the second upper wire 621 may at least partially overlap the second lower wire 620 at the second side. In addition, the second upper wire 621 may not be provided in the third extension portion 530.

The first upper dummy pattern 712 may be disposed at the first side while being spaced apart from the first upper wire 611 on the first insulating layer 830. In the exemplary embodiments, the first upper dummy pattern 712 and the first lower dummy pattern 711 may be disposed on different layers, and may overlap each other. Accordingly, the first dummy pattern 710 including the first lower dummy pattern 711 and the first upper dummy pattern 712 may be provided.

The second upper dummy pattern 722 may be disposed at the second side while being spaced apart from the second upper wire 621 on the first insulating layer 830. In the exemplary embodiments, the second upper dummy pattern 722 and the second lower dummy pattern 721 may be disposed on different layers, and may overlap each other. Accordingly, the second dummy pattern 720 including the second lower dummy pattern 721 and the second upper dummy pattern 722 may be provided.

Each of the first upper wire 611, the second upper wire 621, the first upper dummy pattern 712, and the second upper dummy pattern 722 may include a metal, an alloy, metal nitride, conductive metal oxide, a transparent conductive material, and the like. These may be used alone or in combination with each other. In other exemplary embodiments, each of the first upper wire 611, the second upper wire 621, the first upper dummy pattern 712, and the second upper dummy pattern 722 may have a multilayer structure including a plurality of metal layers. For example, the metal layers may have mutually different thicknesses or may include mutually different materials.

The second insulating layer 840 may be disposed on the first upper wire 611, the second upper wire 621, the first upper dummy pattern 712, and the second upper dummy pattern 722. The second insulating layer 840 may be disposed along a profile of the first upper wire 611, the second upper wire 621, the first upper dummy pattern 712, and the second upper dummy pattern 722 with a uniform thickness to cover the first upper wire 611, the second upper wire 621, the first upper dummy pattern 712, and the second upper dummy pattern 722 on the first insulating layer 830. The second insulating layer 840 may include an inorganic insulating material or an organic insulating material.

The upper insulating layer 850 may be disposed on the second insulating layer 840. The upper insulating layer 850 may be disposed over the second insulating layer 840. The upper insulating layer 850 may include an organic insulating material.

The upper substrate 860 may be disposed on the upper insulating layer 850. The upper substrate 860 may be disposed over the upper insulating layer 850. In the exemplary embodiments, a step which protrudes further than a periphery thereof may be formed in a portion where each of the first contact hole 511, the first dummy pattern 710, the second contact hole 521, and the second dummy pattern 720 is formed. For example, the first step 861 may be formed at a portion where the first contact hole 511 is located, the second step 862 may be formed at a portion where the second contact hole 521 is located, the third step 863 may be formed at a portion where the first dummy pattern 710 is located, and the fourth step 864 may be formed at a portion where the second dummy pattern 720 is located. The upper substrate 860 may include PI, PET, PEN, PP, PC, PS, PSul, PE, PPA, PES, PAR, PCO, MPPO, urethane, TPU, and the like. The upper substrate 860 may further include a light blocking material to have a black color.

The display device 100 according to the exemplary embodiments of the present invention may have a relatively large number of steps at the first side and the second side.

Compared to FIG. 9, when the upper protective film 910 is disposed on the upper substrate 860, the upper protective film 910 may have a relatively large contact area with the upper substrate 860 at the first side and the second side due to the steps, and while the signal transmission film 500 onto which the upper protective film 910 is attached is bent, the upper protective film 910 and the signal transmission film 500 may not be separated from each other at the first side and the second side.

FIGS. 10, 11, 12, and 13 are plan views showing a method of manufacturing a display device according to exemplary embodiments of the present invention.

In FIGS. 10 and 11, the signal transmission film 500 onto which the upper protective film 910 and the lower protective film 920 are attached may be connected to the one side of the display panel 300. In FIG. 10, before the signal transmission film 500 is bent, the upper protective film 910 may be located on the top surface of the signal transmission film 500 which is parallel to the first surface S1 of the display device 100. In addition, as shown in FIG. 11, before the signal transmission film 500 is bent, the lower protective film 920 may be located on the bottom surface of the signal transmission film 500 which is parallel to the second surface S2 of the display device 100. For example, the upper protective film 910 may include an adhesive film 911 and a protective member 912, and the lower protective film 920 may also include an adhesive film and a protective member (see FIG. 9).

In FIG. 12, after the signal transmission film 500 onto which the upper protective film 910 and the lower protective film 920 are attached is connected to the display panel 300, the lower protective film 920 may be removed from the bottom surface of the signal transmission film 500.

In FIG. 13, after the lower protective film 920 is removed, the fourth extension portions 540 may be bent about the axis extending in the first direction D1. For example, a portion of the upper protective film 910 which overlaps the third extension portion 530 may be fixed to the manufacturing equipment, so that the signal transmission film 500 onto which the upper protective film 910 is attached may be bent.

In FIG. 2, after the signal transmission film 500 onto which the upper protective film 910 is attached is bent, the upper protective film 910 may be removed from the top surface of the upper protective film 910.

Accordingly, the display device 100 shown in FIGS. 1 to 8B may be manufactured.

In the method of manufacturing the display device according to the exemplary embodiments of the present invention, the display device 100 includes the first dummy patterns 710 and the second dummy patterns 720, so that the third step 863 and the fourth step 864 may be formed around the first step 861 and the second step 862, respectively. Accordingly, the upper protective film 910 may additionally make contact with the third step 863 and the fourth step 864, and the adhesion between the upper protective film 910 and the signal transmission film 500 may be relatively increased at the first side. In other words, when the signal transmission film 500 is bent, the upper protective film 910 and the signal transmission film 500 may not be separated from each other at the first side, and the misalignment of the signal transmission film 500 may be prevented.

The present invention may be applied to various electronic devices including a display device. For example, the present invention may be applied to vehicle-display device, a ship-display device, an aircraft-display device, portable communication devices, display devices for display or for information transfer, a medical-display device, etc Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel; and
a signal transmission film connected to one side of the display panel, the signal transmission film including:
   a first extension portion extending in a first direction, wherein a first contact hole is formed at a first side of the first extension portion;
   a second extension portion extending from the first side of the first extension portion in a second direction which is different from the first direction; and
   a first dummy pattern adjacent to the first contact hole at the first side.

2. The display device of claim 1, wherein the signal transmission film further includes:
   a third extension portion extending from a side of the second extension portion in the second direction; and
   fourth extension portions protruding from the first extension portion in a third direction which is opposite to the second direction.

3. The display device of claim 2, wherein the fourth extension portions of the signal transmission film are bent along an axis extending in the first direction such that the signal transmission film is located on a bottom surface of the display panel.

4. The display device of claim 2, wherein the fourth extension portions are connected to the one side of the display panel, and
the first, second, third, and fourth extension portions are connected to and integrally formed with each other.

5. The display device of claim 2, wherein the signal transmission film further includes:
   a first lower wire disposed in the second and third extension portions and the first side of the first extension portion; and
   a first upper wire disposed in the first side of the first extension portion and one of the fourth extension portions.

6. The display device of claim 5, wherein the first lower wire and the first upper wire are connected to each other through the first contact hole at the first side of the first extension portion.

7. The display device of claim 5, wherein the first lower wire and the first upper wire are disposed on mutually different layers.

8. The display device of claim 5, wherein the first dummy pattern includes:
   a first lower dummy pattern spaced apart from the first lower wire; and
   a first upper dummy pattern spaced apart from the first upper wire.

9. The display device of claim 8, wherein the first lower dummy pattern and the first upper dummy pattern are disposed on different layers to overlap each other.

10. The display device of claim 8, wherein the signal transmission film further includes:
    a lower substrate;
    a first insulating layer disposed on the lower substrate to cover the first lower dummy pattern at the first side of the first extension portion, and having the first contact hole which exposes a portion of the first lower wire;
    a second insulating layer disposed on the first insulating layer to cover the first upper dummy pattern and the first upper wire; and
    an upper substrate disposed on the second insulating layer.

11. The display device of claim 10, wherein the upper substrate has a step which protrudes further than a periphery of the upper substrate from a portion where each of the first contact hole and the first upper and first lower dummy patterns is formed.

12. The display device of claim 8, wherein a second contact hole is formed at a second side of the second extension portion, and
    the signal transmission film further includes a second dummy pattern adjacent to the second contact hole.

13. The display device of claim 12, wherein the signal transmission film further includes:
    a second lower wire disposed in the third extension portion and the second side of the second extension portion; and
    a second upper wire disposed in the second side of the second extension portion, the first extension portion, and one of the fourth extension portions.

14. The display device of claim 13, wherein the second lower wire and the second upper wire are connected to each other through the second contact hole at the second side of the second extension portion, and
    the second lower wire and the second upper wire are disposed on different layers.

15. The display device of claim 13, wherein the first lower wire and the second lower wire are located on a same layer, and
    the first upper wire and the second upper wire are located on a same layer.

16. The display device of claim 13, wherein the second dummy pattern includes:
    a second lower dummy pattern spaced apart from the second lower wire; and
    a second upper dummy pattern spaced apart from the second upper wire.

17. The display device of claim 13, wherein the signal transmission film further includes a third wire disposed in the third extension portion, the second extension portion, the first extension portion, and one of the fourth extension portions.

18. The display device of claim 17, wherein the third wire does not overlap the first lower wire and the second lower wire in the third extension portion, and
    the third wire partially overlaps the first upper wire or the second upper wire in the second extension portion and the first extension portion.

19. The display device of claim 1, wherein the display panel includes:
    a display structure; and
    a sensing structure disposed on the display structure, and
    wherein the signal transmission film is connected to the sensing structure.

20. The display device of claim 19, wherein the display panel further includes a protective member disposed on the sensing structure.

* * * * *